(12) United States Patent
Holcombe

(10) Patent No.: US 6,750,669 B2
(45) Date of Patent: Jun. 15, 2004

(54) METHOD FOR CONSTRUCTING A FLEX-RIGID LAMINATE PROBE

(75) Inventor: Brent A. Holcombe, Bellingham, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/237,460

(22) Filed: Sep. 9, 2002

(65) Prior Publication Data

US 2003/0006790 A1 Jan. 9, 2003

Related U.S. Application Data

(62) Division of application No. 09/764,972, filed on Jan. 18, 2001.

(51) Int. Cl.⁷ .................................................. G01R 31/02
(52) U.S. Cl. ...................................... 324/761; 324/754
(58) Field of Search .................................. 324/754–762; 439/55, 66, 71, 82, 91; 361/744–749, 766–767, 791, 807, 808; 29/67, 75, 837–840, 430

(56) References Cited

U.S. PATENT DOCUMENTS

| | | | | | |
|---|---|---|---|---|---|
| 4,205,889 | A | * | 6/1980 | Rieman | 439/82 |
| 5,241,454 | A | * | 8/1993 | Ameen et al. | 439/75 |
| 5,270,903 | A | * | 12/1993 | McMichen et al. | 29/840 |
| 5,355,079 | A | * | 10/1994 | Evans et al. | 324/754 |
| 5,436,568 | A | * | 7/1995 | Woith | 324/758 |
| 5,497,103 | A | * | 3/1996 | Ebert et al. | 324/754 |
| 6,043,669 | A | * | 3/2000 | Carroll | 324/754 |
| 6,312,266 | B1 | * | 11/2001 | Fan et al. | 439/91 |
| 6,330,744 | B1 | * | 12/2001 | Doherty et al. | 324/761 |
| 6,378,757 | B1 | * | 4/2002 | Holcombe et al. | 29/840 |
| 6,466,044 | B1 | * | 10/2002 | Smith | 324/754 |

\* cited by examiner

Primary Examiner—Kamand Cuneo
Assistant Examiner—Jermele Hollington
(74) Attorney, Agent, or Firm—Regan L. Trumper

(57) ABSTRACT

A probe assembly provides the capability to test integrated circuit ("IC") packages mounted onto ball grid arrays. The method comprises the step of first creating the lay out of the flexible attachment. Top and bottom rigid PC Boards are lain out and drilled. The drill creates holes that are the press fit diameter of nail pin. The holes are then plated with an annular ring on the outer exposed surface. The next step comprises laminating the flexible circuit between the two rigid PC Boards. Press fit nail pins are inserted through the holds in one side of the laminate sandwich until flush with the surface of the PC Board. Solder preforms are soldered the bottom surface of the laminate sandwich. The preforms mechanically and electrically attach the pins to the bottom rigid PC Board. A BGA socket can then be attached to the pins extending from the bottom of the laminated Flex-Rigid-Flex assembly.

1 Claim, 2 Drawing Sheets

METHOD FOR CONSTRUCTING A FLEX-RIGID LAMINATE PROBE

This is a Divisional of copending application Ser. No. 09/764,972, filed on Jan. 18, 2001, the entire disclosure of which is incorporated herein by reference.

BACKGROUND

Attaching a Ball Grid Array ("BGA") Zero Insertion Force ("ZIF") socket onto a rigid FR-4 header with press fit pins inserted into it and then attaching that assembly to a flexible circuit using solder preforms is one previous way of providing for a Flex-Rigid-Flex probe with pins.

Another way to provide a Flex-Rigid-Flex probe with pins is to laminate a rigid PC Board to a flexible circuit board and then attach solder balls to either side of the rigid-flex laminate. A socket is then soldered to one side and a PGA header is soldered to the other side of the laminate assembly.

Both of the prior art methods of providing a Flex-Rigid-Flex interposing probe with pins unduly lengthen the bus. Further, construction of the interposing probes utilizing the above mentioned methods results in multiple reflow cycles thus increasing the likelihood of re-reflowing solder connections and creating shorts in the BGA field.

SUMMARY

The present invention provides a method for constructing a Flex-Rigid-Flex interposing probe with pins. The method of the invention allows for reduced bus lengthening by an interposing probe and increases the electrical invisibility of the probe to the target system. Further, the method of the invention integrates the assembly of the Pin Grid Array ("PGA") socket or header with the flexible attachment into a single process containing only one reflow cycle. Still further, the single reflow cycle applies to only one side of the flexible attachment. Still further, the method of the invention provides that SMT components near the pins in the interposing probe be soldered onto the rigid PC board as opposed to the flexible attachment. This increases the durability and reliability of the solder joints in the affected area of the probe.

The method of the invention provides a single step process for solder attaching PGA pins to a BGA header. Also, the method of the invention requires a reduced number of components. As discussed, the durability and reliability of SMT solder joints and BGA solder joints are increased.

The method of the invention also provides for ease in manufacturing a Flex-Rigid probe. The BGA socket can be soldered onto the flexible attachment at the same time as the pins and SMT components are soldered. One reflow cycle reduces the chances of re-reflowing solder balls and creating shorts in the BGA field.

The method of the invention comprises the step of first creating the lay out of the flexible attachment. Top and bottom rigid PC Boards are lain out and drilled. The drill creates holes that are the press fit diameter of nail. The holes are then plated with an annular ring on the outer exposed surface. The next step comprises laminating the flexible circuit between the two rigid PC Boards. Press fit nail pins are inserted through the holds in one side of the laminate sandwich until flush with the surface of the PC Board. Solder preforms are soldered the bottom surface of the laminate sandwich. The preforms mechanically and electrically attach the pins to the bottom rigid PC Board. A BGA socket can then be attached to the pins extending from the bottom of the laminated Flex-Rigid-Flex assembly.

DETAILED DESCRIPTION

Figure 1A:
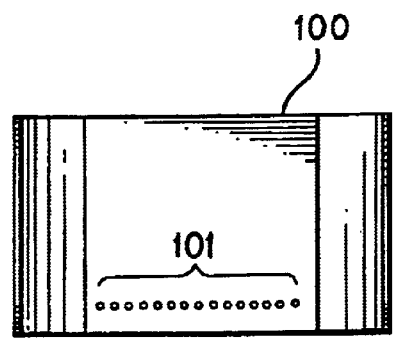
FIGS. 1A–C show a progressive view of a probe assembly during various steps of a preferred embodiment of the method of the invention.
Figure 1B:
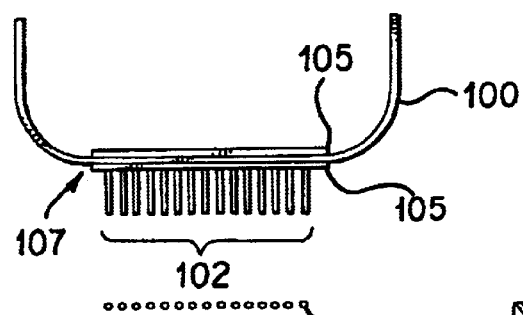
Figure 1C:
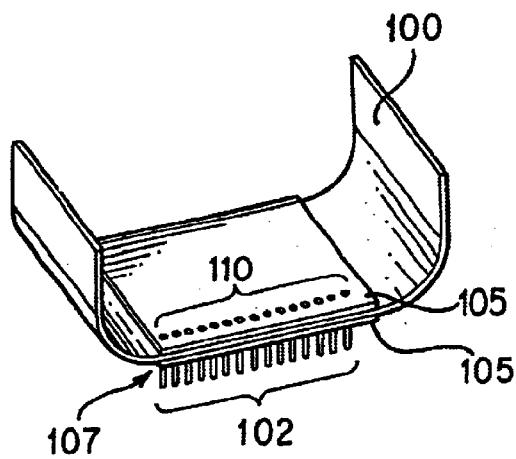
Figure 3:
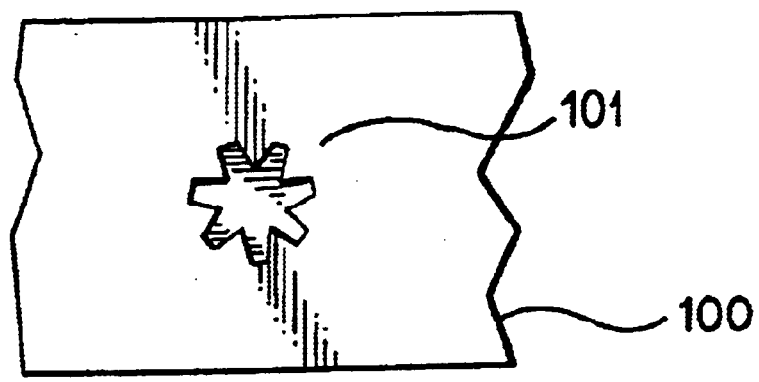
FIG. 3 shows a top view of an unetched star pattern in a flexible circuit.
Figure 4:
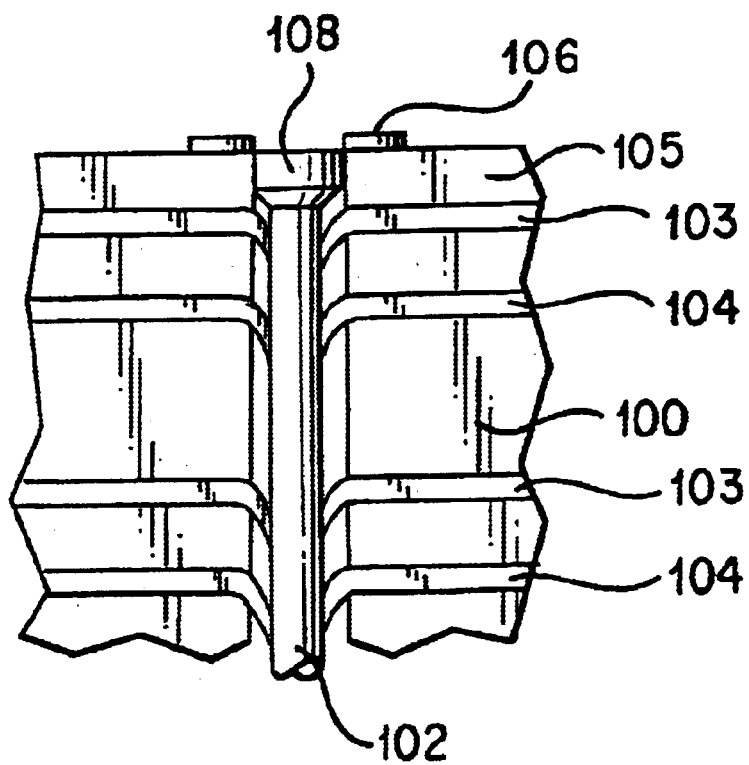
FIG. 4 shows a partial side view of a single pin inserted through a flex circuit with a plurality of signal layers and ground layers.

The present invention provides a simple method for constructing a pins in Flex-Rigid laminate probe. FIGS. 1A–C show a progressive view of a Flex-Rigid laminate probe assembly with pins. Referring now to FIG. 1A, a lay out of the flexible circuit is created. The flexible circuit 100 is etched. The flexible circuit layout 100 includes a variable number of inner signal layers. Each of these variable number of signal layers have a star pattern 101 left unetched. FIG. 1A shows a single row of the unetched star patterns 101 and it is understood that the flexible circuit layout 100 has a plurality of rows of unetched star patterns 101. FIG. 3 shows an enlarged top view of one of the unetched star patterns 101 in the flexible circuit layout 100. Preferably, the star pattern 101 is at a diameter slightly larger than the diameter of the nail pin to be inserted and attached to the flexible circuit 100. The star pattern 101 creates a spring contact of the signal layers with the inserted pin once the pin is inserted. FIG. 4 shows a partial side view of a single pin 102 inserted through a flex circuit 100 with a plurality of signal layers 103 and ground layers 104. The plurality of signal layers 103 and ground layers 104 contact the nail pin 102 as allowed by the star pattern 101.

A top and bottom pair of rigid PC Boards 105 are laid out. The PC Boards are drilled with a plurality of holes in a pattern matching the plurality of star patterns 101 to a press fit diameter of the nail pin 102. It is understood that a press fit diameter allows the nail pins 102 to be inserted into the holes with a low insertion force ("LIF"). Preferably, the holes are plated with an annular ring 106 on the outer exposed surface.

Referring now to FIG. 1B, the flexible circuit 100 is laminated between the two PC boards 105. A plurality of nail pins 102 are press fit into the laminate stack 107 until the heads 108 of the nail pins 102 are flush with the surface of the top rigid PC Board 105. Solder preforms 111 are placed over the top of protruding nail pins and reflowed to mechanically and electrically attach the pins to the bottom rigid PC Board 105. Once the plurality of nail pins 102 have been soldered into place with the solder preforms, a Ball Grid Array ("BGA") socket can be attached to the nail pin heads 108. Attachment of a BGA socket to the nail pin heads is understood by those skilled in the art.

To FIG. 1C, a perspective view of a Flex-Rigid laminate assembly is shown. The flexible circuit 100 is laminated to an upper and lower rigid PC Board 105. A plurality of holes 110 through which the plurality of nail pins 102 pass is shown in the top board 105. Nail pins 102 protrude through the laminate stack 107 with the heads 108 being flush with the top rigid PC Board 105.

Figure 2:
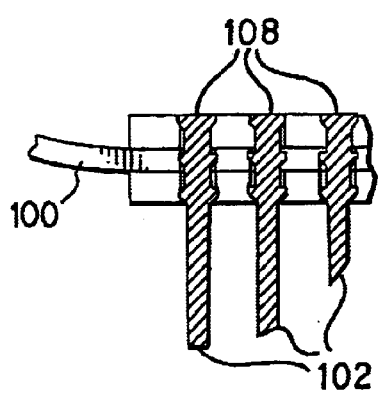
FIG. 2 shows a side view of a flex-rigid-flex laminate probe assembly constructed in accordance with the method of the invention.

FIG. 2 shows an expanded sectional view of pins in a Flex-Rigid laminate structure. Flexible circuit 100 is between the two PC Boards 102. Nail pins 102 extend through the laminate structure 107 and the heads 108 are flush with the tip PC Board 102.

While the present invention has been illustrated and described in connection with the preferred embodiment, it is not to be limited to the particular structure or steps shown. The foregoing description of the present invention has been presented for the purposes of illustration and description only. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A probe assembly comprising:
   a flexible circuit, said flexible circuit having a layout etched thereon with said layout forming a pattern of unetched portions;
   an upper and a lower rigid PC Board, said upper and lower rigid PC Boards having a plurality of holes drilled therein in a pattern matching said unetched portions pattern; and
   a plurality of nail pins, each of said plurality of pins having a head and being electrically conductive;
   wherein, said flexible circuit is laminated between said upper and lower PC Boards, said plurality of nail pins are press fit through said holes in said PC Boards until extending through said bottom PC Board and said heads are flush with said top PC Board and said pins are soldered to said bottom PC Board by a plurality of solder preforms placed over said pins and reflowed.

* * * * *